(12) United States Patent
Hamdioui et al.

(10) Patent No.: US 8,910,001 B2
(45) Date of Patent: Dec. 9, 2014

(54) GENERIC MARCH ELEMENT BASED MEMORY BUILT-IN SELF TEST

(75) Inventors: Said Hamdioui, Zoetermeer (NL); Zaid Al-Ars, Delft (NL); Georgi Nedeltchev Gaydadjiev, Delft (NL); Adrianus van de Goor, Gouda (NL)

(73) Assignee: Technische Universiteit Delft, Delft (NL)

( * ) Notice: Subject to any disclaimer, the term of this patent is extended or adjusted under 35 U.S.C. 154(b) by 156 days.

(21) Appl. No.: 13/635,004

(22) PCT Filed: Mar. 16, 2011

(86) PCT No.: PCT/NL2011/050182
§ 371 (c)(1),
(2), (4) Date: Nov. 15, 2012

(87) PCT Pub. No.: WO2011/115485
PCT Pub. Date: Sep. 22, 2011

(65) Prior Publication Data
US 2013/0086440 A1    Apr. 4, 2013

(30) Foreign Application Priority Data
Mar. 16, 2010 (NL) ................................ 2004407

(51) Int. Cl.
*G11C 29/12* (2006.01)
*G11C 29/16* (2006.01)
*G11C 29/10* (2006.01)
G11C 29/36 (2006.01)
G11C 29/56 (2006.01)

(52) U.S. Cl.
CPC .............. *G11C 29/12* (2013.01); *G11C 29/16* (2013.01); G11C 2029/3602 (2013.01); *G11C 29/10* (2013.01); G11C 29/56 (2013.01)

USPC ............................ 714/720; 714/718

(58) Field of Classification Search
CPC ........ G11C 29/12; G11C 29/10; G11C 29/16; G11C 29/56; G11C 29/3602; G11C 29/3202; G06F 11/27
USPC ........................ 714/720, 719, 718
See application file for complete search history.

(56) References Cited

U.S. PATENT DOCUMENTS 7,178,076 B1    2/2007   Zarrineh et al.
(Continued)

FOREIGN PATENT DOCUMENTS

EP    0 529 945    3/1993

OTHER PUBLICATIONS

International Search Report dated Jun. 27, 2011, corresponding to PCT/NL2011/050182.

(Continued)

*Primary Examiner* — Shelly A Chase
*Assistant Examiner* — Christian Dorman
(74) *Attorney, Agent, or Firm* — Young & Thompson

(57) ABSTRACT

Method for testing a memory under test (1) including a plurality of memory cells and a Memory Built-In Self-Test Engine (2) connectable to a memory under test. The MBIST engine (2) is arranged to generate appropriate addressing and read and/or write operations to the memory under test (1). The MBIST engine (2) is connected to a March Element Stress register (MESR) (3), a generic march element register (GMER) (4), and a Command Memory (5). The GMER (4) specifies one of a set of Generic March Elements (GME), and the MESR (3) specifies the stress conditions to be applied. Only a few GMEs are required in order to specify most industrial algorithms. The architecture is orthogonal and modular, and all speed related information is contained in the GME. In addition, only little memory is required for the specification of the test, providing a low implementation cost, yet with a high flexibility.

19 Claims, 2 Drawing Sheets

(56) References Cited

U.S. PATENT DOCUMENTS

Figure 1:
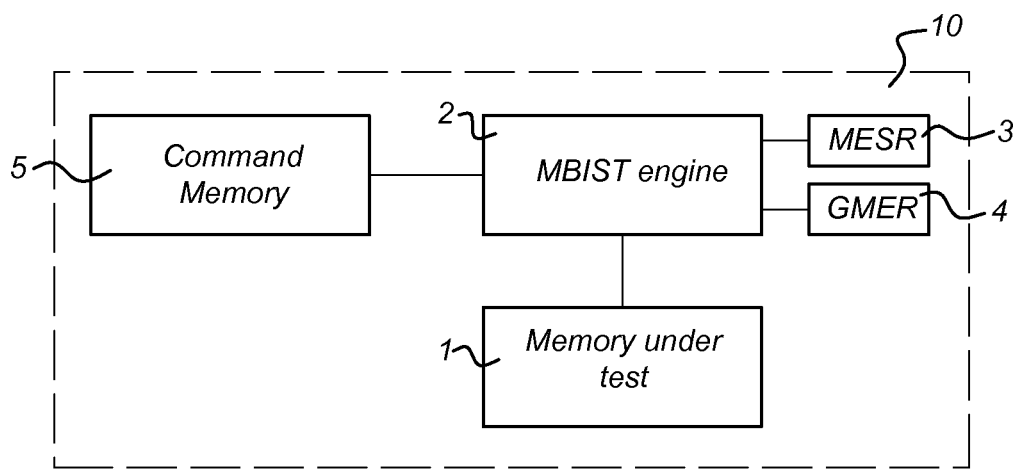

2006/0156133 A1* 7/2006 Mukherjee et al. ........... 714/733
2007/0106923 A1    5/2007 Aitken et al.
2010/0058126 A1* 3/2010 Chang et al. ................. 714/718

OTHER PUBLICATIONS

Ching-Hong Tsai, et al.; Processor-Programmable Memory BIST for Bus-Connected Embedded Memories; 2001; pp. 325-330.

Po-Change Tsai, et al.; "FSM-based Programmable Memory BIST with Macro Command"; 2005; pp. 72-77.

* cited by examiner

US 8,910,001 B2

GENERIC MARCH ELEMENT BASED MEMORY BUILT-IN SELF TEST

FIELD OF THE INVENTION

The present invention relates to a method for testing a memory under test comprising a plurality of memory cells, the method comprising reading a set of GME-MBIST commands from a command memory.

PRIOR ART

Because of the large number of embedded memory cores on a die and the low accessibility of those cores, Memory Built-In Self-Test (MBIST) is a common industrial practice for testing these cores. When implementing MBIST engines, tradeoffs are made depending on (a) the number of supported algorithms, (b) the flexibility of the MBIST engine (in order to cope with the unexpected), (c) the implementation speed and (d) the area overhead.

The article by Ching-Hong Tsai et al. "Processor-programmable memory BIST for bus-connected embedded memories" published in 2001 describes the use of a Finite State Machine (FSM) to apply the MEs of a test, while a microprocessor is used to feed the FSM. This allows for at-speed testing, and reduces the test time considerably, as compared with test application using only the microprocessor. For example, for March C—the test application time reduced from 114*n cycles to 30+10*n cycles (n=the number of memory locations). This article describes a method wherein a ME is identified by a number. However, the ME's used are not generic, as e.g. the Data Value definition is still part of the ME's used, as a result of which a larger set of ME's is needed resulting in a higher amount of Command Memory (CM) being used.

Furthermore, the prior art methods have very limited applicability, because they are restricted to regular ME's. Nested March Elements or Hammer type of March Elements are not made possible by these prior art methods.

Based on the level at which memory algorithms are specified, MBIST engines can be classified into three classes. First, at the algorithm level: Only a single (or a few) algorithms can be specified; they are implemented in hardware. Secondly, at the March Element (ME) level: Applying an algorithm consists of successively scanning the algorithm's MEs, together with its algorithm stress combination. In order to be able to perform memory tests at-speed, it is sufficient that each of the individual MEs is performed at-speed. An example of an implementation can be found in the article by R. Aitken 'A modular Wrapper Enabling High Speed BIST and Repair for Small Wide Memories', In Proc. of the IEEE Int. Test Conf., paper 35.2, pp. 997-1005, 2004.

Thirdly, memory algorithms may be specified at the memory operation level: This class of MBIST engines allows for the specification of algorithms by specifying each of the operations of the algorithm; naturally, this can be very flexible. It should be noted however, that the implementation cost is effectively determined by the size of the program memory and the supported addressing scheme(s). Therefore, two subclasses can be distinguished.

A: Those which support linear algorithms (i.e., march algorithms). The motivation is its simple implementation and low hardware overhead. An example thereof is published in the article by Koike, H. et al. (1990). *A BIST Scheme Using Microprogram ROM for Large Capacity Memories*. In Proc. IEEE Int. Test Conf.; pp. 815-822.

B: Those which support linear and non-linear algorithms with a variety of addressing schemes. Lately, because of the increasing susceptibility of memories to speed related faults, MBIST engines have to be able to support linear and non-linear algorithms. An example of this type of algorithm can be found in the article by X. Du et al. 'Full-Speed Field-Programmable Memory BIST Architecture', in Proc. of the IEEE Int. Test Conf., paper 45.3, 2005.

SUMMARY OF THE INVENTION

The present invention seeks to provide an improved method and hardware implementation to be able to execute memory built-in self-test in a more efficient manner.

According to the present invention, a method according to the preamble defined above is provided, in which the method further comprises executing the set of GME-MBIST commands, which includes a test having a finite sequence of Generic March Elements (GME's), each GME being a march element comprising a finite sequence of operations applied to a memory cell in the memory under test before progressing to the next memory cell and specifying operations and generic data values of the march element, wherein the GME-MBIST commands are executed by operations on a Generic March Element Register (GMER) and a March Element Stress Register (MESR), the GMER specifying one of a set of Generic March Elements (GME's), and the MESR specifying the stress conditions to be applied, and performing the associated GME specified by the GMER and MESR to memory cells of the memory under test.

This embodiment is based on the Generic March Element (GME) concept. A GME is a March Element specifying a test (operations) for the memory under test and generic data values of the march element. The GME is orthogonal to all other specifications of a march element. A GME further allows for the Address Order and Data Value to be specified. Only a few different GMEs are required in order to specify most industrial algorithms. The architecture underlying the present method embodiment is orthogonal and modular, while the implementation does not require fancy schemes such as prefetching and pipelining, because all speed related information is contained in the GME. In addition, a very small command memory is required for the specification of the tests, resulting in a low implementation cost, yet with a high flexibility.

The GME MBIST architecture according to the present invention embodiment optimizes the Command Memory (CM) size to an absolute minimum. It accomplishes that by minimization at three levels: (1) the test set level, (2) the set of March Elements level, and (3) the single March Element level. It has been shown that levels (1) and (2) are very effective in minimizing the CM requirements. Prior art implementations do not achieve any CM minimization at level (1) and level (2), while it has been shown that these two levels are the most effective.

The present invention embodiments are based on fully Generic MEs and does not have any limitations with regard to the applicable algorithms. In addition, CM size is minimized at all levels: at the test set level, the set of ME's level, and at the single ME level. The present invention GME has maximal applicability, because it is truly generic, and provides an increased effectiveness.

In a further aspect the present invention relates to an MBIST engine connectable to a memory under test, wherein the MBIST engine is arranged to generate appropriate addressing and read and/or write operations to the memory under test, the MBIST engine being connected to a March Element Stress register (MESR), a generic march element register (GMER), and a Command Memory, and arranged to retrieve and interpret GME-MBIST instructions from the program memory by interacting with the MESR and the GMER in order to execute a test.

In an even further aspect, the present invention relates to a memory unit (e.g. a semiconductor memory unit such as an SRAM) comprising a plurality of memory cells and an MBIST engine according to one of the present invention embodiments in communication with the plurality of memory cells.

SHORT DESCRIPTION OF DRAWINGS

Figure 2:
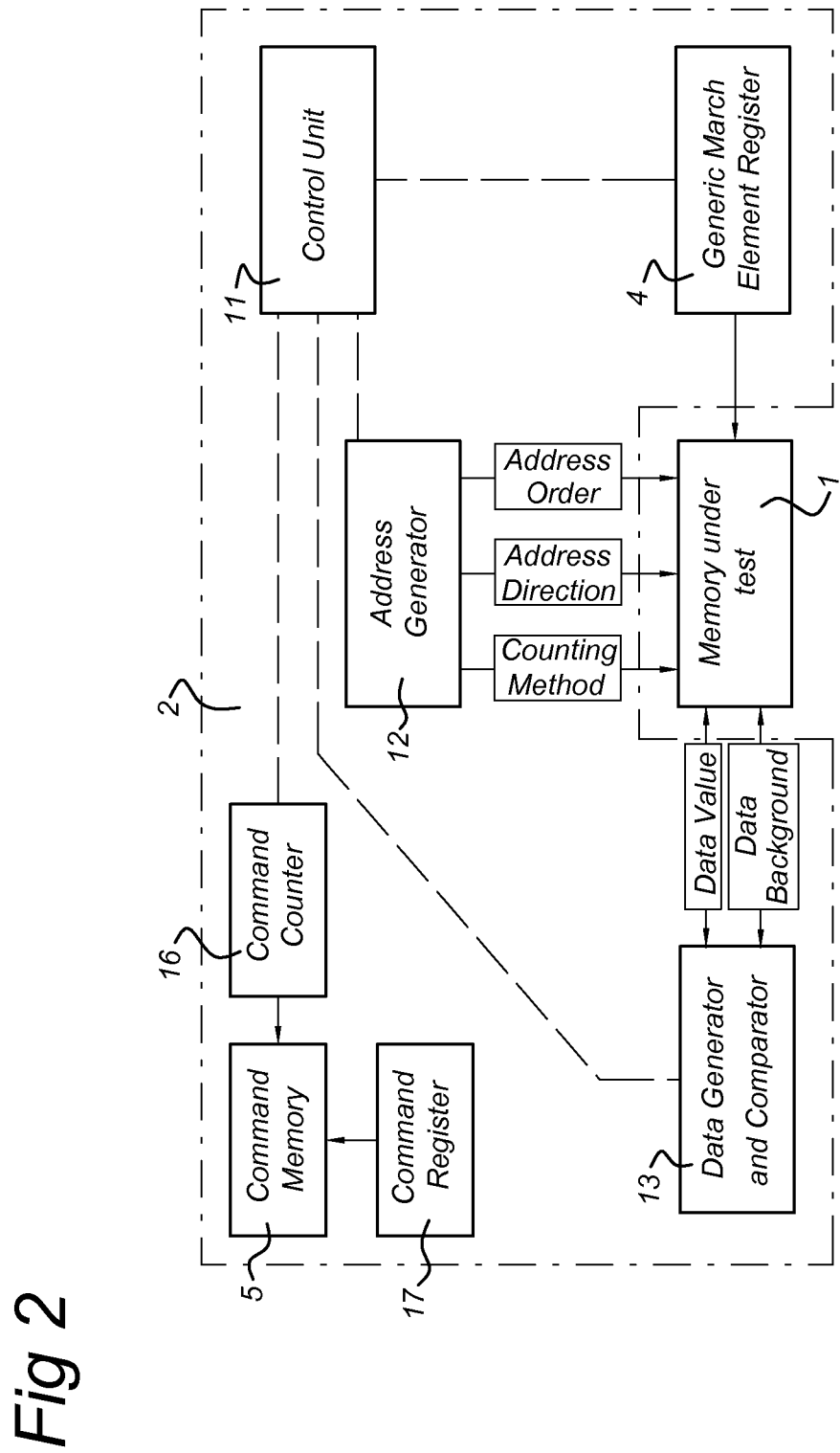

The present invention will be discussed in more detail below, using a number of exemplary embodiments, with reference to the attached drawings, in which FIG. 1 shows a schematic diagram of an implementation of an MBIST engine in a memory unit; and FIG. 2 shows a schematic diagram of a more detailed implementation of an MBIST engine.

DETAILED DESCRIPTION OF EXEMPLARY EMBODIMENTS

The present invention will be explained in detail using a number of embodiments of the present invention, and relates to a method for testing a memory under test, as well as to a Memory Built-In Self-Test (MBIST) engine 2 which may be integrated with or in a semiconductor (memory) chip 10. The present embodiments allow at-speed testing of memory cells in a memory under test, i.e. on a chip itself, allowing also dynamic characteristics to be measured.

The present invention embodiments as will be described below, use a concept named a "Generic March Element" (GME) to design an orthogonal and modular Memory Built-In Self-Test (MBIST) architecture. A GME is a March Element (ME) which specifies the operations and the generic data values of the march element. This is orthogonal to all other specifications of the march element.

In MBIST based on GME's only a few different GME's are required in order to specify most industrial algorithms. The architecture is orthogonal and modular, while the implementation does not require fancy schemes such as prefetching and pipelining, because all speed related information is present in the GME. In addition, a very small command memory is used for the specification of the algorithms, resulting in a low implementation cost, yet with a high flexibility. The GME based MBIST architecture consists of mainly two registers and a command set of two to eight commands. The architecture is based on a few orthogonal concepts, which can be combined in any way, and hence, allowing for many combinations.

The GME's are compact, and by providing required Stress Combinations (SCs) (data-backgrounds, address orders, address directions) most industrial algorithms can be specified. Every combination is possible, i.e. any GME can be combined with any of the SCs, hence allowing many combinations at lower hardware cost.

In FIG. 1 a schematic diagram is shown of an implementation of a Memory Built-In Self-Test (MBIST) engine 2. In a memory unit 10 (e.g. a semiconductor memory chip, such as an SRAM core), a memory under test 1 is present, which is the actual memory unit used in normal operation of the memory unit 10 and comprises a plurality of memory cells. Some of the (semiconductor) real estate of the memory unit 10 is used for the MBIST circuitry, which comprises an MBIST engine 2, able to communicate with all memory cells of the memory unit 10 (i.e. address each cell and read and/or write data from/to each cell). The MBIST engine 2 is further in communication with a Command Memory (CM) 5, a March Element Stress Register (MESR) 3 and a Generic March Element Register (GMER) 4.

The Command Memory 5 in operation stores a test comprising a sequence of a number of GME-MBIST commands which together specify the test. The test comprises a sequence of Generic March Elements (GMEs), each GME comprising a finite sequence of operations (read, write) applied to cells in the memory under test 1. All memory cells in the memory under test 1 may be subject of the test (e.g. grouped in memory cores), or a subset of all memory cells.

It is noted that the MESR 3, GMER 4 and CM 5 may be considered as an integral part of the MBIST engine 2, being implemented as a piece of MBIST circuitry on the semiconductor real estate of a memory unit 10.

The MBIST engine 2 is arranged to execute the present method embodiments, which in one embodiment comprises reading a set of GME-MBIST commands from a Command Memory 5, executing the set of GME-MBIST commands, which includes a test having a finite sequence of Generic March Elements (GME's), each GME being a march element comprising a finite sequence of operations applied to a memory cell in the memory under test 1 before progressing to the next memory cell and specifying operations and generic data values of the march element, wherein the GME-MBIST commands are executed by operations on a Generic March Element Register (GMER) 4 and a March Element Stress Register (MESR) 3, the GMER 4 specifying one of a set of Generic March Elements (GME's), and the MESR 3 specifying the stress conditions to be applied, and performing the associated GME specified by the GMER 4 and MESR 3 to memory cells of the memory under test 1.

In FIG. 2 a block diagram is shown of an exemplary embodiment of an MBIST engine 2 according to the present invention. As indicated with reference to FIG. 1, the MBIST engine 2 communicates with the memory under test 1. An overall Control Unit 11 is implemented, which controls all other elements in the MBIST engine 2 to be discussed below. In this embodiment, the MBIST engine 2 comprises the Command Memory 5, which co-operates with a Command Counter 16 and a Command Register 17, which allow the MBIST engine 2 to run through the consecutive GME-MBIST commands under control of the Control Unit 11.

The MBIST engine 2 further comprises a Generic March Element Register 14, which in this embodiment is arranged to generate the appropriate sequence of read and/or write operations.

Also, an Address Generator 12 is provided, which allows to address each of the plurality of memory cells in the memory under test 1, as well as a Data Generator and Comparator 13, which allows to properly provide or check data which is used for a specific test. In combination, the Address Generator 12 and Data Generator and Comparator 13 form an embodiment of the MESR 3.

In one embodiment, the GMER 4 is a n-bit register, n being an integer, specifying one of a set of Generic March Elements (GME's), the set comprising a maximum of $2^n$ GME's. This allows addressing of GME's using only n bits, e.g. n=4.

In a further embodiment, the MESR 3 comprises a 6-bit register, comprising a 1-bit field for the parameter Addressing Order (AO); a 1-bit field for the parameter Data Value (DV); a 2-bit field for the parameter Counting Method and Addressing Direction (CM & AD); and a 2-bit filed for the parameter Data Background (DB). These parameters will be discussed in more detail below.

In a specific embodiment, the MBIST engine 2 is arranged to generate appropriate addressing and read and/or write operations to the memory under test 1, the MBIST engine 2 being connected to a March Element Stress Register 3, a Generic March Element Register 4, and a Commands Memory 5, and arranged to retrieve and interpret GME-MBIST commands from the Command Memory 5 by interacting with the March Element Stress Register 3 and the Generic March Element Register 4 in order to execute a test. Furthermore, the MBIST engine 2 may further comprise a Control Unit 11 in communication with the Command Memory 5, March Element Stress Register 3 and Generic March Element Register 4, which Control Unit 11 is arranged to execute the method according to any one of the method embodiments described herein.

As shown in the embodiment of FIG. 2, the architecture of the GME-MBIST engine 2 can be described in terms of a number of registers and commands. As shown in FIG. 2, the Memory under test 1 is controlled by a set of orthogonal signals, from the GMER 4, the Address Generator 12 and the Data Generator and Comparator 13 (together forming the MESR 3). These orthogonal signals can be combined in any way. For example, the GME is orthogonal to any of the components of the Stress Combination (SC), such as the AO and the AD. This allows that any GME can be applied with any SC. The algorithms described below and applied in the present embodiments comprise linear and nonlinear algorithms, and are described below with an extended notation for march algorithms. March algorithms are the most common algorithms used for testing memories 1. A march test consists of a finite sequence of March Elements (MEs). A ME is a finite sequence of operations applied to a cell in the memory under test 1 before proceeding to a next cell. The way one proceeds to the next cell is determined by the Address Order (AO) which can be an increasing address order (e.g., increasing AO from the cell 0 to the cell n−1), denoted by a ⇑ symbol, or a decreasing AO, denoted by a ⇓ symbol, and which is the exact inverse of the ⇑ AO. When the AO is irrelevant, the symbol ⇕ (i.e., ⇑ or ⇓) will be used. Moreover, an index can be added to the address order symbol, such that the addressing range (in the plurality of memory cells in the memory under test 1) can be explicitly specified. For example $\Uparrow_{i=0}^{n-1}$ denotes: increase the addresses from the cell 0 to the cell n−1.

An operation can be a:
w0: write 0 into a cell.
w1: write 1 into a cell.
r0: read a cell with expected value 0.
r1: read a cell with expected value 1.

In addition, the cell to which the operation is applied can be explicitly given by subscripting the operation. For example, $w0_i$ means write 0 into a cell i (i.e., $c_i$).

A complete march test is delimited by an accolade bracket pair '{ ... }', while a march element is delimited by a normal bracket pair '( ... )'. ME's are separated by semicolons, and the operations within an ME are separated by commas. An example of a march test is the MATS+test:

{⇕ (w0); ⇑ (r0,w1); ⇓ (r1,w0)} which comprises the march elements ⇕ (w0), ⇑ (r0,w1) and ⇓ (r1,w0). In order to make the notation and the concepts more clear, the MATS+algorithm is shown in pseudo code below. Note that all operations of a ME are performed at a certain address of a cell in the memory under test 1, before proceeding to the next address.

```
| for all i
| write 0 to c[i];
| for (i=0; i<= n−1; i++)
| { read c[i];
| write 1 to c[i];
| }
| for (i=n−1; i>=0; i−−)
| { read c[i];
| write 0 to c[i];
| }
```

An algorithm stress specifies the way the algorithm is performed, and therefore it influences the sequence and/or the type of the memory operations the MBIST engine 2 executes to cells of the Memory under test 1. These stresses have shown to be important for the Fault Coverage (FC) of the algorithm. The following stresses are of interest for the present invention embodiments:

1. The Address Direction (AD): This parameter is the extension of the one dimensional AO to the two dimensional space of a memory cell array. A real memory (i.e. the Memory under test 1) comprises a number of rows and columns (and thus also of a number of diagonals). The AD parameter specifies the direction that the address sequence has to be performed and consists of three types: Fast-row, Fast-column and Fast-diagonal.

Fast-row (Fast-column, Fast-diagonal) increments or decrements the row address (column address, diagonal address) most frequently. To indicate the Fast-row, Fast-column and Fast-diagonal AD, the subscripts r, c and d are used with the AO, respectively; e.g., $_r$⇑ indicates ⇑ AO with the Fast-row AD.

2. The Counting Method (CM): This parameter determines the address sequence. Many CMs exist; e.g., there are six ways of address counting for a 3-address memory: 012, 021, 102, 120, 201 and 210. It has been shown that the CM is important for detecting Address Decoder Delay Faults (AD-DFs). The most common CM is the Linear CM, denoted by the superscript 'L' of the AO (e.g., $^L$⇑), where L specifies the (Linear) address sequence 0,1,2,3, etc. Because it is the default CM, the superscript 'L' may be left out, in other words, when no superscript is used with the AO, the Linear CM is used.

Another CM is the Address Complement (AC). The AC specifies an address sequence: 000, 111, 001, 110, 010, 101, 011, and 100; each bold address is the 1's complement of the preceding address.

The $2^i$ is another CM, typically used in the MOVI algorithm. It requires that the algorithm is repeated N times (N=is the number of memory address bits) with an address increment/decrement value of $2^i$.

Further CM's can be Gc=Gray code, Wc=Worst-case Gate-delay, or Pr=Pseudo-random

3. The Data Background (DB): This parameter defines the data pattern which is actually in the cells of the memory cell array of the Memory under test 1. The four DBs commonly used in industry are (the '/' indicating a new row):

Solid (sDB): all 0s (i.e., 0000 ... /0000... ) or all 1s.
Checkerboard (bDB): 0101 ... /1010 ... 0101 ... / 1010 ...
Column Stripes (cDB): 0101 ... /0101 ... /0101 ... / 0101 ...
Row Stripes (rDB): 0000 ... /1111 ... /0000 ... / 1111 ...

A 'w0' means that the selected DB is applied; a 'w1' means that the inverse of that DB is applied.

Memories (i.e. the memories under test 1 in this description) can exhibit static and dynamic faults. Static faults are not time or speed dependent; their detection does not require at-speed testing. Dynamic faults are speed dependent and do require at-speed tests. Especially Address Decoder Delay Faults (ADDFs) are increasing in importance, because address decoders typically comprise of pre-decoders, connected to local word line decoders and local column decoders via long wires with many via's. Because of production tolerances, the wiring is susceptible to resistance and capacitance variations, while the increasing number of via's experiences extra resistive defects, causing RC delays.

Table 1 lists a set of algorithms which can be considered candidates for a possible MBIST implementation. The column GME # lists the Generic March Elements the algorithm is composed of, this will be discussed in more detail below with reference to Table 2.

In order to help the understanding of the notations used, the GalPat algorithm (i.e., Algorithm #15 in Table 1) will be explained in more detail.

This Galpat algorithm is non-linear and has a time complexity of $O(n^2)$. It has the property that for a given victim cell (v-cell), which has e.g., the value '1', Address Transitions (ATs) are made from all other memory cells (including testing of the victim cell by reading its data). These other cells are denoted as the aggressor cells (a-cells). GalPat detects all ADDFs, because each cell will become v-cell during execution of the algorithm and ATs are made between all cells. The algorithm applies a Read-after-Read (RaR) sequence, which means that a 'rx' operation is applied to the a-cell, followed by a 'rx' operation to the v-cell. In the march notation for GalPat '⇑$_v$(w1$_v$, ⇑$_{-v}$(r0, r1$_v$), w0$_v$)' denotes a nested ME. The inner ME ⇑$_{-v}$(r0, r1$_v$) is applied for each v-cell; the AO '⇑$_{-v}$' means that all addresses are visited, except the v-cell, which has to be skipped; hence the subscript '−v'. The test length of GalPat is too long for larger and/or slower memories under test 1. Subsets of this algorithm are the GalRow and the GalCol algorithms (see Alg #16 and Alg #17 in Table 1). These have the property that for a given v-cell, the a-cells are limited to the row or the column of the v-cell. The complexity of both GalRow and GalCol is of order $O(n^{3/2})$.

TABLE 1

| # | Name | GME# | Description |
|---|---|---|---|
| 1 | Scan | 0, 1 | {⇓ (w0); ⇑ (r0); ⇑ (w1); ⇓ (r1)} |
| 2 | MATS+ | 0, 2 | {↕ (w0); ⇑ (r0, w1); ⇓ (r1, w0)} |
| 3 | March C− | 0, 1, 2 | {↕ (w0); ⇑ (r0, w1); ⇑ (r1, w0); ⇓ (r0, w1); ⇓ (r1, w0); ↕ (r0)} |
| 4 | March C+ | 0, 1, 3 | {↕ (w0); ⇑ (r0, w1, r1); ⇑ (r1, w0, r0); ⇓ (r0, w1, r1); ⇓ (r1, w0, r0); ⇓ (r0)} |
| 5 | PMOVI | 0, 3 | {⇓ (w0); ⇑ (r0, w1, r1); ⇑ (r1, w0, r0); ⇓ (r0, w1, r1); ⇓ (r1, w0, r0)} |
| 6 | March B | 0, 4, 5, 6 | {↕ (w0); ⇑ (r0, w1, r1, w0, r0, w1); ⇑ (r1, w0, w1); ⇓ (r1, w0, w1, w0); ⇓ (r0, w1, w0)} |
| 7 | Algor. B | 0, 6, 7 | {↕ (w0); ⇑ (r0, w1, w0, w1); ⇑ (r1, w0, r0, w1); ⇓ (r1, w0, w1, w0); ⇓ (r0, w1, r1, w0)} |
| 8 | March G | 0, 3, 4, 5, 6, 15 | {↕ (w0); ⇑ (r0, w1, r1, w0, r0, w1); ⇑ (r1, w0, w1); ⇓ (r1, w0, w1, w0); ⇓ (r0, w1, w0); Del100; ⇑ (r0, w1, r1); Del100; ⇑ (r1, w0, r0)} |
| 9 | March U | 0, 2, 7 | {↕ (w0); ⇑ (r0, w1, r1, w0); ⇑ (r0, w1); ⇓ (r1, w0, r0, w1); ⇓ (r1, w0)} |
| 10 | March LR | 0, 1, 2, 7 | {↕ (w0); ⇓ (r0, w1); ⇑ (r1, w0, r0, w1); ⇑ (r1, w0); {⇑ (r0, w1, r1, w0); ⇑ (r0)} |
| 11 | March LA | 0, 1, 8 | {↕ (w0); ⇑ (r0, w1, w0, w1, r1); ⇑ (r1, w0, w1, w0, r0); ⇓ (r0, w1, w0, w1, r1); ⇓ (r1, w0, w1, w0, r0); ⇓ (r0)} |
| 12 | March SS | 0, 1, 9 | {↕ (w0); ⇑ (r0, r0, w0, r0, w1); ⇑ (r1, r1, w1, r1, w0); ⇓ (r0, r0, w0, r0, w1); ⇓ (r1, r1, w1, r1, w0); ↕ (r0)} |
| 13 | March RAW | 0, 10, 1 | {↕ (w0); ⇑ (r0, w0, r0, r0, w1, r1); ⇑ (r1, w1, r1, r1, w0, r0); ⇓ (r0, w0, r0, r0, w1, r1); ⇓ (r1, w1, r1, r1, w0, r0); ↕ (r0)} |
| 14 | BLIF | 0, 11 | {↕ (w0); ⇑ (w1, r1, w0); ⇑ (w1); ⇑ (w0, r0, w1)} |
| 15 | GalPat | 0, 16 | {↕ (w0); ⇑$_v$(w1$_v$, ⇑$_{-v}$(r0, r1$_v$), w0$_v$); ↕ (w1); ⇑$_v$(w0$_v$, ⇑$_{-v}$(r1, r0$_v$), w1$_v$)} |
| 16 | GalRow | 0, 17 | {↕ (w0); ⇑$_v$(w1$_v$, ⇑$_{R-v}$(r0, r1$_v$), w0$_v$); ↕ (w1); ⇑$_v$(w0$_v$, ⇑$_{R-v}$(r1, r0$_v$), w1$_v$)} |
| 17 | GalCol | 0, 17 | {↕ (w0); ⇑$_v$(w1$_v$, ⇑$_{C-v}$(r0, r1$_v$), w0$_v$); ↕ (w1); ⇑$_v$(w0$_v$, ⇑$_{C-v}$(r1, r0$_v$), w1$_v$)} |
| 18 | Gal9r | 0, 12 | {↕ (w0); ⇑$_v$(w1$_v$, ⇑$_\square$(r0, r1$_v$), w0$_v$); ↕ (w1); ⇑$_v$(w0$_v$, ⇑$_\square$(r1, r0$_v$), w1$_v$)} |
| 19 | Butterfly | 0, 18 | {↕ (w0); ⇑$_v$(w1$_v$, ⇑$_{BF}$(r0$_{BF}$, r1$_v$), w0$_v$); ↕ (w1); ⇑$_v$(w0$_v$, ⇑$_{BF}$(r1$_{BF}$, r0$_v$), w1$_v$)} |
| 20 | Walk1/0 | 0, 19 | {↕ (w0); ⇑$_v$(w1$_v$, ⇑$_{-v}$(r0), r1$_v$, w0$_v$); ⇑ (w1); ⇑$_v$(w0$_v$, ⇑$_{-v}$(r1), r0$_v$, w1$_v$)} |
| 21 | WalkRow | 0, 20 | {↕ (w0); ⇑$_v$(w1$_v$, ⇑$_{R-v}$(r0), r1$_v$, w0$_v$); ⇑ (w1); ⇑$_v$(w0$_v$, ⇑$_{R-v}$(r1), r0$_v$, w1$_v$)} |
| 22 | WalkColumn | 0, 20 | {↕ (w0); ⇑$_v$(w1$_v$, ⇑$_{C-v}$(r0), r1$_v$, w0$_v$); ⇑ (w1); ⇑$_v$(w0$_v$, ⇑$_{C-v}$(r1), r0$_v$, w1$_v$)} |
| 23 | HamWh | 0, 21 | {↕ (w0); ⇑ (r0, w1$^h$, r1); ⇑ (r1, w0$^h$, r0); ⇑ (r0, w1$^h$, r1); ⇑ (r1, w0$^h$, r0)} |
| 24 | HamRh | 0, 22 | {↕ (w0); ⇑ (r0, w1, r1$^h$, r1); ⇑ (r1, w0, r0$^h$, r0); ⇑ (r0, w1, r1$^h$, r1); ⇑ (r1, w0, r0$^h$, r0)} |
| 25 | HamWDhrc | 0, 23 | {↕ (w0); ↗ (w1$^h_v$, ⇑$_{R-v}$(r0), r1$_v$, ⇑$_{C-v}$(r0), r1$_v$, w0$_v$); ↕ (w1); ↗ (w0$^h_v$, ⇑$_{R-v}$(r1), r0$_v$, ⇑$_{C-v}$(r1), r0$_v$, w1$_v$)} |
| 26 | HamWDhc | 0, 24 | {↕ (w0); ↗ (w1$^h_v$, ⇑$_{C-v}$(r0), w0$_v$); ↕ (w1); ↗ (w0$^h_v$, ⇑$_{C-v}$(r1), w1$_v$)} |
| 27 | MOVI | 0, 3 | {⇓ (w0); ⇑ (r0, w1, r1); ⇑ (r1, w0, r0); ⇓ (r0, w1, r1); ⇓ (r1, w0, r0)} Apply2i CM |
| 28 | DELAY | 0, 2, 21 | {↕ (w0); Del50; ⇑ (r0, w1); Del50; ⇓ (r1, w0)} |

Note:

⇑$_\square$: apply operations to eight neighbors of the v-cell

⇑$_{-v}$: apply operations to all cells, except the v-cell

⇑$_{R-v}$: apply operations to all cells of same Row as the v-cell, except the v-cell ⇑$_{C-v}$: apply operations to all cells of same Column as the v-cell, except the v-cell ↗ : apply operations to all elements on the main diagonal of the array ⇑$_{BF}$: apply operations to cells with distance of 2k to the North, East, South & West of the v-cell R = the number of Row address bits C = the number of Column address bits h = number of hammer operations BF = ButterFly Del50 and Del100 are delays of 50 and 100 ms

TABLE 2

| B | GME# | Description | Alg.# |
|---|---|---|---|
| 0 | 0 | $\updownarrow$ (wD) | 1-28 |
| 0 | 1 | $\updownarrow$ (rD) | 1, 3-4, 10-13 |
| 0 | 2 | $\updownarrow$ (rD, w$\overline{D}$) | 2-3, 9-10, 28 |
| 0 | 3 | $\updownarrow$ (rD, w$\overline{D}$, r$\overline{D}$) | 4-5, 8, 27 |
| 0 | 4 | $\updownarrow$ (rD, w$\overline{D}$, r$\overline{D}$, wD, rD, w$\overline{D}$) | 6, 8 |
| 0 | 5 | $\updownarrow$ (rD, w$\overline{D}$, wD) | 6, 8 |
| 0 | 6 | $\updownarrow$ (rD, w$\overline{D}$, w$\overline{D}$, wD) | 6, 8 |
| 0 | 7 | $\updownarrow$ (rD, w$\overline{D}$, r$\overline{D}$, wD) | 7, 9-10 |
| 0 | 8 | $\updownarrow$ (rD, w$\overline{D}$, wD, w$\overline{D}$, r$\overline{D}$) | 11 |
| 0 | 9 | $\updownarrow$ (rD, rD, wD, rD, w$\overline{D}$) | 12 |
| 0 | 10 | $\updownarrow$ (rD, wD, rD, rD, w$\overline{D}$, r$\overline{D}$) | 13 |
| 0 | 11 | $\updownarrow$ (wD, rD, w$\overline{D}$) | 14 |
| 0 | 12 | $\Uparrow_v$ (wD$_v$,$\Uparrow_\square$ (r$\overline{D}$, rD$_v$), w$\overline{D}_v$) | 18 |
| 0 | 13 | Spare | — |
| 0 | 14 | Del 50 | 28 |
| 0 | 15 | Del100 | 8 |
| 1 | 0 | $\updownarrow$ (wD) | 1-28 |
| 1 | 1 | $\updownarrow$ (rD) | 1, 3-4, 10-13 |
| 1 | 16 | $\Uparrow_v$ (wD$_v$,$\Uparrow_{-v}$ (r$\overline{D}$, rD$_v$), w$\overline{D}_v$) | 15 |
| 1 | 17 | $\Uparrow_v$ (wD$_v$,$\Uparrow_{X-v}$ (r$\overline{D}$, rD$_v$), w$\overline{D}_v$) | 16-17 |
| 1 | 18 | $\Uparrow_v$ (wD$_v$,$\Uparrow_{BF}$ (r$\overline{D}_{BF}$, rD$_v$), w$\overline{D}_v$) | 19 |
| 1 | 19 | $\Uparrow_v$ (wD$_v$,$\Uparrow_{-v}$ (r$\overline{D}$), rD$_v$, w$\overline{D}_v$) | 20 |
| 1 | 20 | $\Uparrow_v$ (wD$_v$,$\Uparrow_{X-v}$ (r$\overline{D}$), rD$_v$, w$\overline{D}_v$) | 21-22 |
| 1 | 21 | $\Uparrow$ (rD, w$\overline{D}^h$, r$\overline{D}$) | 23 |
| 1 | 22 | $\Uparrow$ (rD, w$\overline{D}$, r$\overline{D}^h$, r$\overline{D}$) | 24 |
| 1 | 23 | $\nearrow$ (wD$^h{}_v$,$\Uparrow_{R-v}$ (r$\overline{D}$), rD$_v$,$\Uparrow_{C-v}$ (r$\overline{D}$), rD$_v$, w$\overline{D}$)$_v$) | 25 |
| 1 | 24 | $\nearrow$ (wD$^h{}_v$,$\Uparrow_{C-v}$ (r$\overline{D}$), w$\overline{D}_v$) | 26 |

An even more simplified version of GalPat is Gal9r. It performs the same operations as GalPat, but only involving 9 neighboring cells, not complete rows, columns. This reduces the algorithm time complexity from $O(n^2)$ to $O(n)$, see Alg #18 in Table 1. Even though Gal9r is a highly simplified version of GalPat, it's fault coverage is impressive as compared with regular march algorithms.

In the following, the current invention embodiments are described in more detail, and it is shown that only a limited number of GME's are sufficient for executing a large number of known algorithms for MBIST. Also, it is shown that a limited number of stress combinations are needed as input in order to be able to execute these algorithms.

In one embodiment the set GME's comprises at least a write operation with irrelevant AO and a data value from the set comprising '0' and '1', using the notification: $\updownarrow$ (wD), wherein D denotes the Data value which is either 0 or 1.

Using GMEs allows for the specification of the stress combinations: Address Order (AO), Data Value (DV), Address Direction (AD) with AD$\in$ {r,c}, and Counting Method (CM) with CM$\in$ {Linear, Address complement, $2^i$}. E.g., the GME '$\updownarrow$ (wD)' denotes the set of MEs with AO$\in$ { $\Uparrow$ , $\Downarrow$ }, and DV=D$\in$ {0, 1}, resulting in a large set of possible ME's.

Thus, a ME may be identified in a program using the reference in the March element Stress Register 3 and GME Register 4.

In order to be able to specify an algorithm using GMEs, it is important that the set of GME's is not too large. Table 2 shows the GMEs with which each of the algorithms of Table 1 can be made. The first column lists the GME #, while 'Alg #' lists the algorithms of Table 1 which use the corresponding GME. The GMER contains an index (GME #), which is used by the MBIST engine 2 hardware to generate the appropriate sequence of read and/or write operations.

The column GME # in Table 1 shows which GMEs of Table 2 are used for the corresponding algorithm. For example, PMOVI (i.e., Alg #5) is composed of GMEs #0 and #3. Table 2 shows that only a few GMEs are required to support any of the algorithms of Table 1. Most commercial sets of algorithms would require less than 16 GMEs. The algorithm GalRow/WalkRow requires Fast-column, while GalCol/WalkCol requires Fast-row, therefore they can share the same GME; the AD determines which is intended. As a result, one of the present invention embodiments can suffice with a GME Register 4 with only n=4 bits, allowing to index $2^n$=16 GMEs.

The fault coverage of an algorithm depends to a large extent on the used Stress Combination (SC) as discussed above. Algorithms #1 through #14 and #27 of Table 1 can be applied with any set of values of the SCs; i.e., DB$\in$ { sDB, bDB, rDB, cDB}, CM$\in$ {Lin, AC, $2^i$}, AD$\in$ {Fast-row, Fast-col, Fast-diag}, and AO$\in$ { $\Uparrow$ , $\Downarrow$ }.

However, algorithms #15 through #26 can only be applied with a restricted set of SCs, as explained below. For example, by inspecting GalPat one can conclude that it requires sDB, because all a-cells have to be in the same state. Usually the following SC is used: sDB, Binary CM (because it is the most simple), Fast-column (because it also is most easy to implement), and the $\Uparrow$ AO. Similar constraints apply to GalRow, GalCol, Gal9r, Butterfly, Walk1/0, WalkRow and WalkCol. The MOVI has to be applied with the $2^i$ CM, while the Hammer algorithms can be applied with the Binary CM and sDB.

As a result of this analysis on GME's and Stress Conditions, present invention embodiments are proposed which have the following architecture, as shown (and discussed above) in FIGS. 1 and 2.

The GME-MBIST architecture supports registers 3-5, 12-17 which can be divided into two classes: the Basic registers and the Extension registers. The basic registers are part of a minimal GME-MBIST engine 2, while the Extension registers support some of the advanced features of the GME-MBIST engine 2. The register naming convention is such that the register name includes its size. For example, 'CC[5 . . . 0]' denotes the 6-bit Command Counter, its most significant bit is bit-5, its least significant bit is bit-0; 'AOR[0]' denotes a 1-bit Address Order Register.

The basic registers are part of the minimal GME-MBIST engine 2.

1. CC[5 . . . 0]: Command Counter 16

Size depends on Command Memory 5 (CM) size; default: 6 bits. The CC 16 points to a location in the CM 5, which contains the to-be-executed command.

2. CM[63 . . . 0,3 . . . 0]: Command Memory 5

Size depends on size of used test set; default: 64 4-bit nibbles. The CM 5 contains the commands which specify the to-be-executed tests.

3. CR[7 . . . 0]: Command Register 17

Contains the first two nibbles of the command.

4. MESR: March Element Stress Register 3

The March Element Stress Register (MESR) specifies the to-be-applied Stress Combination (SC) which consists of four individual components, each described by its own register, as follows:

AOR[0]: Address Order Register (part of Address Generator 12)

This is a 1-bit register specifies the AO: $\Uparrow$ , $\Downarrow$ .

DVR[0]: Data Value Register (part of Data Generator 13)

Specifies the Data Value (DV); i.e., the interpretation of the '0'-value in the w0 & r0 operations to be:

0: The 'w0' and 'r0' operations assume the specified DB (see DBR)

1: Use the inverted DB.

CMADR[1 . . . 0]: Counting Method & Address Direction Register (part of Address Generator 12)

This register specifies the combination of the to be used Counting Method (CM) and the Address Direction, as follows:
   Lr: Linear CM & Fast-row
   Lc: Linear CM & Fast-column
   AC: Address Complement CM
   —: Reserved.
   DBR [1 . . . 0]: Data Background Register (part of Data Generator 13)

When the algorithm specifies a data value, such as for example in 'w0', then the '0' value is interpreted as meaning the Data Background (DB) as specified in the DBR. This allows for the following DBs to be specified:
   sDB: solid DB
   bDB: checkerboard DB
   rDB: row stripes DB
   cDB: column stripes DB.
   5. GMER[3 . . . 0]: Generic March Element Register 4

The GMER 4 is a 4-bit register which specifies the to be applied GME, within the current bank, as described in Table 2. Note that the GMER only contains a number (or index GME #), rather than a complete specification of a GME. The GME-MBIST hardware uses the GME # to generate the appropriate sequence of read & write operations, together with their data values.

The extension registers are used to support features of the GME-MBIST architecture; they are optional.
   1. BR[0]: Bank Register The GMER allows for the specification of up to 16 GMEs. Some applications may have a need for a larger number of GMEs. In order to support this requirement, the set of GMEs is divided into banks, each containing up to 16 GMEs. The GME # specifies the GME in the bank, while the bank is specified via the BR. In this embodiment the size of the BR is 1-bit, because this already allows for up to 32 GMEs; however, depending on the application, it may have a different size.
   2. REPR[5 . . . 0]: Re-execute Entry Point Register The REPR is used by the REP (REPeat) and the POWi commands, which allow a Block of Commands (BoC) to be re-executed a number of times. The starting address of this BoC is stored in the REPR, which has the same size as the CC (Command Counter).
   3. RCNT[3 . . . 0]: Re-execute CouNT The RCNT specifies the number of times a BoC has to be re-executed by the REP command. For the POWi command, the BoC is re-executed 'N−1' times; N is the # of address bits. Note that the size of the RCNT register has to be the larger one of the following two values: 4, as needed by the REP command, and $[\log_2(N)]$ for the POWi command.

The architecture supports commands to control the operation of the GME-MBIST engine 2. These commands act like instructions on a traditional computer; however, the term command is used to avoid confusion with the host architecture of the GME-MBIST engine 2, which is likely to have the capability to execute instructions.

Two classes of commands can be recognized: Implicit and Explicit Implicit commands are issued outside control of the user; typically as a side-effect of a system action or state (for example Power-On). The only implicit command for the GME-MBIST engine 2 is the Power-On-Reset (POR) command. When the host system powers on, a hardwired POR command is given. This causes the following actions in the GME-MBIST engine 2:
   CC[5 . . . 0]←0. Clear the Command Counter 16.
   BR[0]←0. Clear the Bank Register.

All other commands are Explicit, which means that they have to be issued explicitly by the user (via commands in the Command Memory 5). They are designed in such a way that they have a size (length) which is a multiple of four bits, also called a nibble. The length of the commands is variable in size, such that the Command Memory 5 size can be minimized; the most frequent commands are encoded in the smallest number of nibbles. This reflects itself in the number of bits used for specifying the Opcode; which is also variable in length. Last, similar to the registers 3-5, 12-17, the set of explicit commands can be divided into the classes: Basic and Extension. The following Table 3 summarizes the commands together with their bit assignments.

TABLE 3

| Command | BE | \multicolumn{6}{c|}{Bit positions in the command} | Xtra |
|---------|----|---|---|---|---|---|---|------|
|         |    | 7 | 6 | 5 | 4 | 3 | 2 | 1 | 0 |      |
| INIT    | B  | Opc | AO | DV | CM&AD | DB | — |
| SGME    | B  | Opc | AO | DV | GME# | — |
| SAODV   | E  | Opc | AO | DV |     |     | — |
| SAODVE  | E  | Opc | AO | DV | CM&AD | Opc | G# |
| SBR     | E  |     | Opc |     | B | — |
| SREP    | E  |     | Opc |     |   | — |
| REP     | E  | Opc | AO | DV | Opc | R |
| POWi    | E  | Opc | AO | DV | Opc | — |

'BE' = Basic or Extension;
'Xtra'= exTra nibbles
'G#' = GME# in current Bank (4-bits);
'—' = not applicable
'R' = RCNT#, CM&AD-DBRCNT#, . . . , CM&AD-DV2, CM&AD-DV1

The column 'Xtra' indicates the meaning of the extra nibbles for commands which require more than 2 nibbles. Note: the commands will be described in terms of their operations, which involve the basic and the extension registers. If a feature is not present, then the extension registers to support that feature will not be present. However, the description of the commands assumes the presence of all features, in order to give a complete picture The command set of the GME-MBIST engine 2 is designed such that the properties of algorithms are exploited. For example, the INIT instruction uses an implicit GME, namely '↕ (wD)'. Many algorithms contain a sequence of MEs which can be expressed by the same GME. For example March C—repeats the generic GME ↕ (rD,w$\overline{D}$) four times, with two AO and two DV combinations.

In order to control the MESR 3 and the GMER 4 by the MBIST engine 2, the following commands are proposed: The basic command set consists of only two commands and allow for an absolute minimal implementation of the GME-MBIST engine 2.
   1. INIT: INITialize The 2-nibble INIT command specifies an Opcode (a two bit field, to be interpreted by MBIST engine 2), the values of the AO (one bit field), the DV (one bit field), the CM & AD (two bit field), and the DB (two bit field). In addition, it clears the GMER 4, such that the first GME in Table 2 (GME #0, which is '↕ (wD)') is specified implicitly. From Table 2 one can see that all algorithms start with this GME #0; it's implicit specification in the INIT command reduces the instruction length by four bits. Note that this command when executed establishes the values for the fields CM & AD and DB in the MESR 3, which will remain established until another INIT command is given.

INIT is a complex command, because it performs the following implicit and explicit operations, which are typical for the beginning of any test.

CMADR←CM & AD; DBR←DB.
GMER←0; AOR←AO; DVR←DV.
Apply ME specified in GMER.
This should be the '↕(wD)' GME.
CC←(CC)+2.
Update Command Counter with 2, because INIT is a 2-nibble command.
REPR←(CC); RCNT←0.
The REPR now points to the command following the INIT command.

2. SGME: Select Generic March Element. The 8-bit SGME command specifies the associated Opcode (two bits), the AO (one bit), the DV (one bit) and the GME # (four bits). When executed, this instruction sets the relevant fields in the MESR 3 and GMER 4:
AOR←AO; DVR←DV; GMER←GME #.
Apply GME specified in GMER.
CC←(CC)+2.

The extension commands allow for added capabilities of the basic GME-MBIST engine 2. This can consist of extra functionality and/or a reduction of the required Command Memory 5 size to represent tests.

SAODV: Select AO and DV. This 4-bit command specifies the associated Opcode (two bits) the AO (one bit) and the DV (one bit). Upon execution the relevant fields are set in the MESR 3.

The operation of the SAODV command is as follows:
AOR←AO; DVR←DV.
Apply GME specified in GMER.
CC←(CC)+1.
Note: the SAODV command is 1 nibble in size.

SAODVE: Select AO, DV, CM & AD and GME #

From inspecting Table 1 one may conclude that the selection of the 'CM & AD' applies to all MEs of the test. However, in some rare cases this does not hold. For example, the Philips 6n algorithm $\{_r\Uparrow(w0);_r\Uparrow(r0, w1);_c\Downarrow(r1,w0, r0)\}$ requires the use of the SAODVE command, because in addition to the GME #, the AO, and the DV; the AD of the ME '$_c\Downarrow$(r1,w0, r0)' differs from the two preceding MEs. The suffix 'E' of the SAODVE command denotes an Extension of the 'SAODV' command, in order to specify the GME #. This command is 3 nibbles in length; the third nibble specifies the GME #. SAODVE allows for the specification of the AO, DV, the CM & AD and the GME #, as follows:
AOR←AO; DVR←DV.
CMADR←CM & AD.
GMER←GME #.
Apply GME specified in GMER.
CC←(CC)+3.

SBR: Set Bank Register

The default size of the GMER[3 . . . 0] is 4 bits; such that one out of up to 16 GMEs can be specified. The choice of the 4-bit field for specifying a GME is made to reduce the size of the Command Memory 5, and because of the fact that commands have a size which is a multiple of a nibble. Therefore, the set of GMEs is divided into banks with a maximum of 16 GMEs. The Bank 'B' parameter of the SBR command specifies the bank, as follows:
BR[0 ]←B.
Note that if up to 64 GMEs have to be supported, then the BR will be 2 bits; i.e, BR[1 . . . 0], and the SBR has a 2-bit 'B' parameter.
CC←(CC)+2.

SREP: Set Re-execute Entry Point

Sometimes the MEs of a set of tests are put together in a single long test. To save execution time, the state of the memory after a given test is used as the initial state for the following test. Then, if a part of the long test has to be re-executed, the SREP command is required to establish the Entry Point of that part. The operation of SREP is as follows:
CC←(CC)+2.
REPR←(CC); RCNT←0.

REP: REPeat block of commands

Industrial test sets usually contain tests which are a repeated application of an algorithm, whereby Stress Conditions such as the CM & AD, are varied. The REPeat command supports this in a very efficient way. It allows for re-executing a Block of Commands (BoC). The BoC starts at the location specified by the Reexecute Entry Point Register (REPR) and ends at the REP command. The BoC may consist of several algorithms and is repeated a number of times, as specified by the RCNT # field of the REP command.

Each re-execution operation requires the specification of the CM & AD, the AO, and the DV values for GME #0. Table 3 shows the format of the REP command: the first 2 nibbles specify the AO and the DV; the third nibble specifies the RCNT #. Because the BoC has already been executed once before the REP command was encountered, the BoC will be re-executed RCNT #−1 times. The next RCNT #−1 nibbles each specify, for each re-execution, the CM & AD and the DB values for that re-execution. They follow the first 3 nibbles of the REP command in reverse order; i.e., the nibble for the first re-execution is the last nibble, while the nibble for the last re-execution is the 4th nibble. For example, a REP command, which repeats a BoC 3 times, has the following structure. The first 2 nibbles: REP command which specifies the AO and DV, 3rd nibble: RCNT #, 4th nibble: CM & AD and DB for 3rd re-execution, 5th nibble: CM & AD and DB for 2nd re-execution, 6th nibble: CM & AD and DB for $1^{st}$ re-execution.

The result is that the REP command has a variable length of '2+RCNT #' nibbles. The operation of the REP command consists of the following two parts, determined by the contents of the register 'RCNT': an initialization part and a re-execution part.

a. Initialization part
If (RCNT)=0
then:
RCNT←RCNT #.
AOR←AO; DVR←DV.
CMADR and DBR←(CM[(CC)+(RCNT)+1]).
The last nibble of the variable length command is fetched and stored into the CMADR and the DBR.
Apply ME specified in GMER.
CC←(REPR).
Re-execute Block of Commands.

b. Re-execution part
If (RCNT) 6=1 then:
RCNT←(RCNT)−1.
CMADR and DBR←(CM[(CC)+(RCNT)+1]).
A nibble from the variable length command is fetched and stored into the CMADR and the DBR.
AOR←AO; DVR←DV.
Apply ME specified in GMER.
CC←(REPR).
Re-execute Block of Commands.
else:
CC←(CM[(CC)+RCNT #+2]).
The REP command has been completed; continue with command which follows the REP command.

POWi: Re-execute with POWer of 2i addressing

The POWi command is a special case of the REP command: it re-executes a Block of Commands a fixed number of N−1 times; N is the # of address bits, which is hardwired in the GME-BIST engine. During the ith re-execution, the #i is used to generate the address increment/decrement value, which is $2^i$. The RCNT register is used to keep track of the current value of i. The operation of the POWi command is as follows:

(a) Initialization part
If (RCNT)=0
then:
RCNT←N.
N=# of address bits; this is hardwired in the BIST engine.
AOR←AO; DVR←DV.
Apply ME specified in GMER.
CC←(REPR).
Re-execute Block of Commands.

(b) Re-execution part
If (RCNT)≠1
then:
RCNT←(RCNT)−1.
AOR←AO; DVR←DV.
CC←(REPR).
Re-execute Block of Commands.
else:
CC←(CC)+2.
POWi has been completed.

EXAMPLES

From the above it may be clear that only a few simple, and very memory efficient, instructions are needed to implement tests to be executed by the GME-MBIST engine 2. Their efficiency will be demonstrated with the following programming examples.

March C—: {⇓ (w0); ⇑ (r0,w1); ⇑ (r1,w0); ⇓ (r0,w1); ⇓ (r1,w0); ⇑ (r0)} applied with bDB and Lr, can be programmed as follows:

⇓ (w0): INIT with AO=⇓, DV=0, CM & AD=Lr, DB=bDB; implicit: GME #0.
⇑ (r0,w1): SGME with AO=⇑, DV=0 and GME #=2.
⇑ (r1,w0): SAODV with AO=⇑ and DV=1. Note that GMER is not changed; hence, GME #2 still applies.
⇓ (r0,w1): SAODV with AO=⇓ and DV=0.
⇓ (r1,w0): SAODV AO=⇓ and DV=1.
⇑ (r0): SGME with AO=⇑, DV=0 and GME #=1.

Hence in total six commands are required, one per ME; they require: 3*8+3*4=36 bits of program memory, to be loaded and stored in program memory 5.

GalPat:
{⇓ (w0); ⇑$_v$(w1$_v$, ⇑$_{-v}$(r0, r1$_v$), w0$_v$); ⇑ (w1); ⇑ (w0$_v$, ⇑$_{-v}$(r1, r0$_v$), w1$_v$)} applied with sDB and Lc:

⇓ (w0): INIT with AO=⇓, DV=0, CM & AD=Lc, DB=sDB; implicit: GME #0.
⇑$_v$(w1$_v$, ⇑$_{-v}$(r0, r1$_v$), w0$_v$): SGME with AO=⇑, DV=1 and GME #=12.
⇑ (w1): SGME with AO=⇑, DV=1 and GME #=0.
⇑ (w0$_v$, ⇑$_{-v}$(r1, r0$_v$), w1$_v$): SGME with AO=⇑, DV=0 and GME #=12.

Hence in total four commands are required, one per ME; they require: 4*8=32 bits of program memory, to be loaded and stored in program memory 5.

GalRow:
{⇓ (w0); ⇑$_v$(w1$_v$, ⇑$_{R-v}$(r0, r1$_v$), w0$_v$); ⇑ (w1); ⇑$_v$(w0$_v$, ⇑$_{R-v}$(r1, r0$_v$), w1$_v$)} applied with sDB and Lc:

⇓ (w0): INIT with AO=⇓, DV=0, CM & AD=Lc, DB=sDB; implicit GME #0.
⇑$_v$(w1$_v$, ⇑$_{R-v}$(r0, r1$_v$), w0$_v$): SGME with AO=⇑, DV=1 and GME #=13. Note: GalRow is applied because 'Lc' is specified.
⇑ (w1): SGME with AO=⇑, DV=1 and GME #=0.
⇑$_v$(w0$_v$, ⇑$_{R-v}$(r1, r0$_v$), w1$_v$): SGME with AO=⇑, DV=0 and GME #=13.

Hence four commands are required, one per ME; they require: 4*8=32 bits of program memory, to be loaded and stored in program memory 5.

Because of the open-ended architecture, extensions to customize this architecture using a MESR 3 and GMER 4 are easy to make. The example below will clarify this.

The instruction SGME (Select GME) as will be described in one of the embodiments below is limited to select out of a maximum of 16 GME's, as it has only four bits addressing space. In most applications this will be sufficient. However, in case of a large set of algorithms, this number may be extended, for example to 32, using a further embodiment.

This problem is solved by placing the GME's in Banks as already indicated in the left column of Table 2. A Bank can hold a maximum of 16 GME's. The new command SBR (Set Bank Register) has a 1-bit parameter 'B' which allows for the specification of the bank. Naturally, if so desired, the number of banks can be increased to four or more. Then the parameter 'B' in the command 'SBR' will be two or three bits, respectively.

It is advisable to include in each Bank the GME '↕ (wD)' (GME #0 in Table 2) and '↕ (rD)' (GME #1 in Table 2) to prevent frequent switching between the GME Banks.

The aim of the proposed MBIST architecture is to support the complete set of known algorithms and stresses, for at speed test application. This set of tests includes the March tests, the GalPat class of tests, hammer tests, etc. The set of stresses include:

AO: Address Order
AD: Address Direction
DB: Data Background
DV: Data Value
CM: Counting Method Testing memories is done with a set of tests. A test consists of an algorithm, such as MATS+, together with a set of stress values. For example, MATS+ is defined as shown in table 1 above. When MATS+ is applied with a set of stress values, it will be a test (For example, when applied with the stress values: AO=⇑, DB=sDB, CM=Li, AD=Fr).

The optimization of the Command Memory (CM) size, has been accomplished at three levels: (1) the set of algorithms level, (2) the set of March Elements level, and (3) the single March Element (ME) level.

Level 1, CM optimization at the set of algorithms level:

Usually, an algorithm is applied several times; each time with a different set of stress values. For example, when MATS+ has been applied with the stress values DB=sDB and AD=Fr, then MATS+ could additionally be applied, for example seven times with the following different stress values:

(1) AD=Fr, DB=bDB; (2) AD=Fr, DB=rDB; (3) AD=Fr, DB=cDB; (4) AD=Fc, DB=sDB; (5) AD=Fc, DB=bDB; (6) AD=Fc, DB=rDB; (7) AD=Fc, DB=cDB. The proposed MBIST engine is capable of exploiting the repetitive application of an algorithm, through the use of the REPeat command.

Example 1, below, shows the effectiveness of the REP command. Two algorithms, MATS+ and PMOVI, are repeated seven times. The Command Memory (CM) efficiency of the REP command can be seen as follows: A single application of MATS+ and PMOVI requires 12 nibbles of CM. Hence, eight individual applications of these two algorithms would require: 8×12=96 nibbles of CM. Example 1 shows that through the use of the REP command, this can be reduced to 22 nibbles. This is only 22/(2×8)=1.375 nibbles per algorithm, per application, and a reduction by 77% over the 8 individual applications. Considering the fact that industrial test sets often re-apply an algorithm with different stress values, the availability of the REP command can reduce the CM requirements considerably. The REP command may be the single, most important contributor to reducing the size of the CM.

Example 1

REPeat(PMOVI & MATS+)

PMOVI: {⇓ (w0); ⇑ (r0,w1,r1); ⇑ (r1,w0,r0); ⇓ (r0,w1,r1); ⇓ (r1,w0,r0)}.
MATS+: {⇑ (w0); ⇑ (r0,w1); ⇓ (r1,w0)}.

This example demonstrates the use of the REP command applied to two tests: PMOVI & MATS+. The first time they are executed using Lr (Linear addressing & Fast-row), together with sDB (solid DB). Then they will be re-executed for Lr & bDB, Lr & rDB, Lr & cDB, and for Lc & sDB, Lc & bDB, Lc & rDB and Lc & cDB. This means that, after the initial execution, they are re-executed 7 times. The following set of commands will implement the above:

PMOVI
 ⇓ (w0). INIT: AO=⇓, DV=0, CMADR=Lr, DBR=sDB.
  Apply implicit GME #0. Note that RCNT will be implicitly cleared here.
 ⇑ (r0,w1,r1). SGME: AO=⇑, DV=0, GMER=3.
 ⇑ (r1,w0,r0). SAODV: AO=⇑, DV=1.
 ⇓ (r0,w1,r1). SAODV: AO=⇓, DV=0.
 ⇓ (r1,w0,r0). SAODV: AO=⇓, DV=1.
MATS+
 ⇑ (w0). SGME AO=⇑, DV=0, GMER=0.
 ⇑ (r0,w1). SGME: AO=⇑, DV=0, GMER2.
 ⇓ (r1,w0). SAODV: AO=⇓, DV=1.
REPeat
  REP: CNTR=8, Lc-cDB, Lc-rDB, Lc-bDB, Lc-sDB, Lr-cDB, Lr-rDB, Lr-bDb.

Nine commands require 4×2+4×1+1×10=22 nibbles of command memory.

Level 2: CM optimization at the set of March Elements level

This effectively means CM optimization at the level of a single algorithm, which by definition consists of a set of MEs. Below March C— and PMOVI are shown.

March C—: {⇑ (w0); ⇑ (r0,w1); ⇑ (r1,w0); ⇓ (r0,w1); ⇓ (r1,w0); ⇑ (0)}
PMOVI: {⇓ (w0); ⇑ (r0,w1,r1); ⇑ (r1,w0,r0); ⇓ (r0,w1,r1); ⇓ (r1,w0,r0)}

By inspecting the algorithms, one sees that a next ME often is identical to the ME just applied; the only difference is the DV and/or the AO. For example, after applying the ME ⇑ (r0,w1) of March C—, the next ME is ⇑ (r1,w0); this is identical to the previous ME, except for the DV. This means that for the application of a next ME, only the AO and/or the DV need to be specified.

Example 2 shows March C—, applied without exploiting the above, while Example 3 shows the CM size can be reduced from 12 to 9 nibbles (this is by 25%), through the use of the SAODV command.

Example 2

March C—: {⇑ (w0); ⇑ (r0,w1); ⇑ (r1,w0); ⇓ (r0,w1); ⇓ (r1,w0); ⇑ (r0)}
applied with bDB and Lr. This March C— test is implemented first by using only the basic commands, as follows:

⇑ (w0).
  INIT: AO=⇑, DV=0, CMADR=Lr, DBR=bDB.
  Implicit application of GME #0.
⇑ (r0,w1). SGME: AO=⇑, DV=0, GMER=2.
⇑ (r1,w0). SGME: AO=⇑, DV=1, GMER=2.
⇓ (r0,w1). SGME: AO=⇓, DV=0, GMER=2.
⇓ (r1,w0). SGME: AO=⇓, DV=1, GMER=2.
⇑ (r0). SGME: AO=⇑, DV=0. GMER=1

A total of six commands are required, one per ME; they require: 6*2=12 nibbles of command memory.

Example 3: March C—: In this case the same test as in Example 2 will be applied but then with bDB and Lr, and by using the extended command 'SAODV':

⇑ (w0).
  INIT: AO=⇑, DV=0, CMADR=Lr, DBR=bDB.
  Implicit application of GME #0.
⇑ (r0,w1). SGME: AO=⇑, DV=0, GMER=2
⇑ (r1,w0). SAODV: AO=⇑. DV=1.
  Note: the GME # of the pievious command applies.
⇓ (r0,w1). SAODV: AO=⇓, DV=0.
⇓ (r1,w0). SAODV: AO=⇓. DV=1.
⇑ (r0). SGME: AO=⇑. DV=0, GMER=1.

Six commands require 3×2+3×1=9 nibbles of command memory. Due to the use of 'SAODV' command, a saving of 25% is realised as compared with Example 2.

Level 3. CM optimization at the single March Element (ME) level

This optimization deals with the notion of the Generic March Element (GME). It has been shown that the set of algorithms used in a given test set can be constructed with only a few MEs; these MEs can be given unique numbers. Hence, in stead of specifying an algorithm by specifying each of its MEs in detail, one can specify an algorithm by summing up the set of unique ME numbers. This has been shown to reduce the amount of CM considerably. Additionally, one can further reduce the set of required MEs, by only considering Generic March Elements (GMEs). A GME consists only of the operations of the ME. For example, the ME⇑ (r0,w1,r1) can be represented generically as (rx,w$\bar{x}$,r$\bar{x}$). This means that all stress values are taken away from the ME. The advantage is that the GME (rx,w$\bar{x}$,r$\bar{x}$) can now also be used to specify ⇑ (r1,w0,r0), by using AO=⇑ and DV=1. Alternatively, the same GME (rx,w$\bar{x}$,r$\bar{x}$) can be used to specify ⇓ (r0,w1,r1), by using AO=⇓ and DV=0; etc. While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:
1. A method for testing a memory under test comprising a plurality of memory cells, the method comprising:
    reading a set of GME-MBIST commands from a Command Memory, executing the set of GME-MBIST commands, which includes a test having a finite sequence of Generic March Elements (GME's), each GME being a march element comprising a finite sequence of operations applied to a memory cell in the memory under test before progressing to the next memory cell and specifying operations and generic data values of the march element, wherein the GME-MBIST commands are executed by operations on a Generic March Element Register (GMER) and a March Element Stress Register (MESR), the GMER specifying one of a set of Generic March Elements (GME's), and the MESR specifying the stress conditions to be applied, and performing the associated GME specified by the GMER and MESR to memory cells of the memory under test, the set of GME-MBIST commands defining a specific test comprises the commands:

INIT, comprising an Opcode field, and fields for initializing the values of the parameters Addressing Order (AO), Data Value (DV), combination of Counting method and Address Direction (CM&AD), and Data Background (DB), which when executed sets the relevant fields in the MESR and clears the GMER to point at a first GME out of the set of GME's; SGME, comprising an Opcode field, fields for setting the value of the parameter Address Order (AO) and Data Value (DV), and a field for specifying an index (GME#) for a GME, which when executed sets the relevant fields in the MESR and the GMER, or a REP command, which comprises an Opcode, a field (RCNT#) specifying the number of times a Block of Commands (BoC) comprising one or more GME's which have to be repeated, and for each repeat, two plus two bit fields specifying the required Counting Method and Address Direction parameter (CM&AD) and Data Background parameter (DB).

2. The method of claim 1, wherein the GMER is a n-bit register, n being an integer, specifying one of the set of GME's, the set comprising a maximum of $2^n$ GME's.

3. The method of claim 1, wherein the set of GME's comprises at least a write operation with irrelevant addressing order and a data value from the set comprising '0' and '1'.

4. The method of claim 1, wherein the MESR comprises a 6-bit register, comprising
 a 1-bit field for the parameter Address Order (AO);
 a 1-bit field for the parameter Data Value (DV);
 a 2-bit field for the parameter Counting Method and Addressing Direction (CM&AD);
 a 2-bit field for the parameter Data Background (DB).

5. The method of claim 1, wherein the set of GME-MBIST commands further comprises the command SAODV, comprising an Opcode field, and fields for setting the value of Addressing Order (AO) and Data Value (DV) in the MESR.

6. The method of claim 1, wherein the INIT instruction comprises 8 bits,
 the SGME instruction comprises 8 bits, and an SAODV instruction comprising an Opcode field, and fields for setting the value of Addressing Order (AO) and Data Value (DV) in the MESR comprises 4 bits.

7. The method of claim 1, the set of GME-MBIST commands further comprising the command: SBR, comprising an Opcode field, and a field for selecting a subset of the set of Generic March Elements.

8. The method of claim 1, wherein an SGME command having a reserved value in the GME index field will result in only a change of the MESR by interpreting the fields for setting the value of the parameter Address Order and Data Value for setting the value of the parameters Counting Method and Address Direction.

9. The method of claim 1, wherein GME-MBIST command set further comprises a POWi command, which comprises an Opcode, the Opcode specifying re-execution of a Block of Commands (BoC) comprising one or more GME's which have to be repeated, a fixed number (N) of times.

10. An assembly of an MBIST engine connectable to a memory under test, a March Element Stress register (MESR), a generic march element register (GMER), and a Command Memory, wherein the MBIST engine is arranged to generate appropriate addressing and read and/or write operations to the memory under test, the MBIST engine being connected to the March Element Stress register (MESR), the generic march element register (GMER), and the Command Memory, and arranged to retrieve and interpret GME-MBIST commands from the Command Memory by interacting with the MESR and the GMER in order to execute a test, wherein the MBIST engine further comprises a Control Unit in communication with the Command Memory, MESR and GMER, which Control Unit (11) is configured for reading a set of GME-MBIST commands from a Command Memory, executing the set of GME-MBIST commands, which includes a test having a finite sequence of Generic March Elements (GME's), each GME being a march element comprising a finite sequence of operations applied to a memory cell in the memory under test before progressing to the next memory cell and specifying operations and generic data values of the march element, wherein the GME-MBIST commands are executed by operations on a Generic March Element Register (GMER) and a March Element Stress Register (MESR), the GMER specifying one of a set of Generic March Elements (GME's), and the MESR specifying the stress conditions to be applied, and performing the associated GME specified by the GMER and MESR to memory cells of the memory under test, the set of GME-MBIST commands defining a specific test comprises the commands:

INIT, comprising an Opcode field, and fields for initializing the values of the parameters Addressing Order (AO), Data Value (DV), combination of Counting method and Address Direction (CM&AD), and Data Background (DB), which when executed sets the relevant fields in the MESR and clears the GMER to point at a first GME out of the set of GME's; SGME, comprising an Opcode field, fields for setting the value of the parameter Address Order (AO) and Data Value (DV), and a field for specifying an index (GME#) for a GME, which when executed sets the relevant fields in the MESR and the GMER, or a REP command, which comprises an Opcode, a field (RCNT#) specifying the number of times a Block of Commands (BoC) comprising one or more GME's which have to be repeated, and for each repeat, two plus two bit fields specifying the required Counting Method and Address Direction parameter (CM&AD) and Data Background parameter (DB).

11. The assembly of claim 10, wherein the GMER is a n-bit register, n being an integer, specifying one of the set of GME's, the set comprising a maximum of $2^n$ GME's.

12. The assembly of claim 10, wherein the set of GME's comprises at least a write operation with irrelevant addressing order and a data value from the set comprising '0' and '1'.

13. The assembly of claim 10, wherein the MESR comprises a 6-bit register, comprising
- a 1-bit field for the parameter Address Order (AO);
- a 1-bit field for the parameter Data Value (DV);
- a 2-bit field for the parameter Counting Method and Addressing Direction (CM&AD);
- a 2-bit field for the parameter Data Background (DB).

14. The assembly of claim 10, wherein the set of GME-MBIST commands further comprises the command SAODV, comprising an Opcode field, and fields for setting the value of Addressing Order (AO) and Data Value (DV) in the MESR.

15. The assembly of claim 10, wherein the INIT instruction comprises 8 bits,
the SGME instruction comprises 8 bits, and an SAODV instruction, comprising an Opcode field, and fields for setting the value of Addressing Order (AO) and Data Value (DV) in the MESR, comprises 4 bits.

16. The assembly of claim 10, the set of GME-MBIST commands further comprising the command:
SBR, comprising an Opcode field, and a field for selecting a subset of the set of Generic March Elements.

17. The assembly of claim 10, wherein an SGME command having a reserved value in the GME index field will result in only a change of the MESR by interpreting the fields for setting the value of the parameter Address Order and Data Value for setting the value of the parameters Counting Method and Address Direction.

18. The assembly of claim 10, wherein GME-MBIST command set further comprises a POWi command, which comprises an Opcode, the Opcode specifying re-execution of a Block of Commands (BoC) comprising one or more GME's which have to be repeated, a fixed number (N) of times.

19. Memory unit comprising a plurality of memory cells and the assembly of claim 10 in communication with the plurality of memory cells.

* * * * *